United States Patent
Mautner et al.

(10) Patent No.: US 10,671,025 B2
(45) Date of Patent: Jun. 2, 2020

(54) TIME-TO-DIGITAL CONVERTER AND CONVERSION METHOD

(71) Applicant: ams AG, Premstaetten (AT)

(72) Inventors: Christian Mautner, Fernitz (AT); Friedrich Bahnmueller, Karlsruhe (DE); Friedrich Laengauer, Wildon (AT); Robert Kappel, Wettmannstaetten (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/470,410

(22) PCT Filed: Dec. 8, 2017

(86) PCT No.: PCT/EP2017/082034
§ 371 (c)(1),
(2) Date: Jun. 17, 2019

(87) PCT Pub. No.: WO2018/114401
PCT Pub. Date: Jun. 28, 2018

(65) Prior Publication Data
US 2020/0110368 A1    Apr. 9, 2020

(30) Foreign Application Priority Data
Dec. 22, 2016   (EP) .................... 16206412

(51) Int. Cl.
*H03M 1/50*     (2006.01)
*G04F 10/00*    (2006.01)
(Continued)

(52) U.S. Cl.
CPC ......... *G04F 10/005* (2013.01); *H03K 23/005* (2013.01); *H03L 7/089* (2013.01);
(Continued)

(58) Field of Classification Search
CPC ....... H03M 1/1009; H03M 1/12; H03L 7/089; H03L 7/0812; H03L 7/0991
(Continued)

(56) References Cited

U.S. PATENT DOCUMENTS

| 8,786,347 B1 | 7/2014 | Chakraborty et al. |
| 2012/0132793 A1 | 5/2012 | Campbell et al. |

(Continued)

FOREIGN PATENT DOCUMENTS

| EP | 0300757 | 1/1989 |
| EP | 0508232 | 10/1992 |

(Continued)

OTHER PUBLICATIONS

European Patent Office, International Search Report for PCT/EP2017/082034 dated Mar. 12, 2018.

*Primary Examiner* — Joseph J Lauture
(74) *Attorney, Agent, or Firm* — Fish & Richardson P.C.

(57) ABSTRACT

A time-to-digital converter arrangement has a ring oscillator with a plurality of inverting elements and a first and a second counter coupled to the ring oscillator. The first counter is configured to increment a first counter value if a positive edge transition is present at one of the inverting elements. The second counter is configured to increment a second counter value if a negative edge transition is present at the one of the inverting elements. A storage element stores the first and the second counter value and logical states of the plurality of inverting elements. A decoder coupled to the storage element selects one of the first and the second counter value as a valid value based on an evaluation of the stored logical states, and outputs a total counter value based on the valid value and the stored logical states.

18 Claims, 4 Drawing Sheets

(51) Int. Cl.
*H03K 23/00* (2006.01)
*H03L 7/099* (2006.01)
*H03M 1/12* (2006.01)
*H03L 7/089* (2006.01)
*H03L 7/081* (2006.01)
*H03M 1/10* (2006.01)

(52) U.S. Cl.
CPC .......... *H03L 7/0812* (2013.01); *H03L 7/0991* (2013.01); *H03M 1/1009* (2013.01); *H03M 1/12* (2013.01)

(58) Field of Classification Search
USPC ......... 341/166, 120, 155; 327/157, 158, 159
See application file for complete search history.

(56) References Cited

U.S. PATENT DOCUMENTS

2013/0153754 A1  6/2013  Drader et al.
2015/0137864 A1  5/2015  Whatmough et al.
2018/0299835 A1* 10/2018  Testi .................... G04F 10/005

FOREIGN PATENT DOCUMENTS

EP  2469301  6/2012
EP  2887096  6/2015
GB  2132043  6/1984

* cited by examiner

TIME-TO-DIGITAL CONVERTER AND CONVERSION METHOD

BACKGROUND OF THE INVENTION

The present disclosure relates to a time-to-digital converter and to a time-to-digital conversion method.

A time-to-digital converter (TDC) is a device used to measure a time interval and convert it into digital output. It allows measurements of very short times at high resolution. A problem with time-to-digital converters is the asynchronous nature of the physical effects that are measured. Each measurement has to be collected for further processing.

A time-to-digital converter is used in time-of-flight cameras, for example, to measure the time an emitted light signal like a laser pulse needs to travel to a reflecting object and back to the camera. A major drawback is that the average distance to all objects in a scene is only detected as a single number.

A well-known technique to implement a TDC uses a ring oscillator and a counter that is being driven by this ring oscillator, in particular by a clock edge progressing through the ring oscillator. A downside of this design is that by the time that the counter is being updated on the output, said edge has already progressed, so there is an inherent uncertainty for a counter value of the counter.

SUMMARY OF THE INVENTION

The present disclosure provides an improved timing concept for time-to-digital conversion that provides a higher accuracy.

The improved timing concept is based on the idea that a ring oscillator with a plurality of inverting elements is used as a fine counter, and two counters being triggered by one of the inverting elements are used as coarse counters. For example, the two coarse counters are triggered with different clock edges of the inverting element, such that one counter counts the positive edges and the other counter counts the negative edges. For determining a total counter value corresponding to an event, one of the two coarse counters is selected based on the evaluation of the logical states at the inverting elements of the ring oscillator, when the event occurs. The selection is made by a decoder having access to the states of the inverting elements and to the counter values of the two coarse counters, e.g. via an intermediate storage of the states and/or values. Hence the counter having a correct and stable counter value can be used for determining the total counter value without any uncertainty. Consequently, the selected counter value is independent of any time difference between occurrence of the edge at the counter's input and the actual update of the associated counter value.

An embodiment of a time-to-digital converter arrangement according to the improved timing concept comprises a ring oscillator, a first and a second counter, a storage element and a decoder. The ring oscillator is equipped with a plurality of inverting elements, wherein each of the inverting elements provides a logical state. The first and the second counter are coupled to the ring oscillator. The first counter is configured to increment a first counter value if a positive edge transition is present at one of the inverting elements. Similarly, the second counter is configured to increment a second counter value if a negative edge transition is present at the one of the inverting elements. The storage element is configured to store the first counter value, the second counter value and the logical states of the plurality of inverting elements. For example, a storage process within the storage element is triggered by a respective trigger signal.

The decoder is coupled to the storage element and configured to select one of the first and the second counter values as a valid value based on an evaluation of the stored logical states. Furthermore, the decoder is configured to output a total counter value based on the valid value and the stored logical states. For example, the total counter value may be calculated from the valid value representing the coarse counter and a numeric representation of the logical states.

For example, the decoder selects the valid value based on an evaluation of a combination of the stored logical states. To this end, for example for each possible combination of logical states of the inverting elements, a specific selection of one of the first and the second counter value is made. Such decision-making may be implemented with a combinatorial logic and/or a lookup table having stored the decision for each possible combination.

In addition or as an alternative, the decoder may select the valid value based on a determination of a position of a propagating edge within a combination of the stored logical states. Hence, depending on the determined position of the propagating edge, it can be decided which of the counter values has safely assumed its value.

In some implementations, the decoder is configured to calculate the total counter value based on a numeric representation of the stored logical states and a multiple of the valid value or of the valid value reduced or incremented by one, depending on the combination of the stored logical states. For example, the decoder may use the knowledge that for a given combination the counter value selected as the valid value may have been incremented without a full period of the ring oscillator having taken place. Such a situation can regularly occur due to the dependency for increments on different clock edges, i.e. the positive and negative edge transitions.

In some implementations the time-to-digital converter arrangement further comprises a stability element coupled between the storage element and the decoder. The stability element is configured to clear metastability conditions of the stored values and states, for example. Such metastability conditions can occur due to timing conditions, which may be different for the different inverting elements, e.g. due to process, voltage and temperature, PVT, variations. The stability element may be implemented with a set of flip-flops, one flip-flop for each logical state, respectively bit lines of the first and the second counter through the storage element.

In some implementations, also two sets of flip-flops may be concatenated. Furthermore, the stability element may be configured to indicate whether the stored logical states are free from any metastable conditions.

In an implementation with only one storage element and one decoder, the total counter value output by the decoder represents a timeframe from the initialization of the ring oscillator and the two counters. For example, such initialization may be a starting event, and an event triggering the storage of the logical states and the counter values represents a stopping event.

In other implementations, it may be desired to record both a starting event and a stopping event with the ring oscillator and the two counters running. To this end, in some implementations the time-to-digital converter arrangement further comprises a further storage element configured to store the first counter value, the second counter value and the logical states of the plurality of inverting elements, and a further decoder. The further decoder is coupled to the further storage element and configured to select one of the first and the second counter value as a second valid value based on an evaluation of the logical states stored in the further storage element. The further decoder is also configured to output a further total counter value based on the second valid value and the logical states stored in the further storage element. Such a time-to-digital converter arrangement further comprises a first difference element.

In such a configuration, the storage element is a starting storage element, wherein storage is triggered by a start signal. Accordingly, the further storage element is a first stopping storage element, wherein storage is triggered by a first stop signal. The decoder is a starting decoder outputting the total counter value as a starting value, and the further decoder is a first stopping decoder outputting the further total counter value as a first stopping value. The first difference element is configured to determine a first difference value between the first stopping value and the starting value. The starting decoder may be a start timestamp decoder, i.e. a decoder for a start timestamp. Similarly, the stopping decoder may be a stop timestamp decoder, i.e. a decoder for a stop timestamp.

Accordingly, in such an implementation, two more or less identical sets of respective storage elements and respective decoders share a common ring oscillator and also share the first and second counter. Hence, all implementations of the decoder described above can also be used for the further decoder. In addition, respective stability elements as described above can be included for each storage element and the associated decoder.

In various implementations, measurements can be performed iteratively with the time-to-digital converter arrangement. For example, iterative time measurements for respective pairs of start and stop signals can be performed. To this end, the time-to-digital converter arrangement may further comprise a histogram block with a number of histogram bins. The histogram block is configured to increment a value of one of the histogram bins selected depending on the first difference value. Preferably, the number of histogram bins more or less corresponds to a possible range of difference values provided by the difference element. Such a histogram block allows evaluation of a distribution of measurement results over a greater number of measurements. This can, for example, be used to find one or more most probable overall measurement results.

In some implementations, a third set of storage element and decoder together with a further difference element can be implemented in the time-to-digital converter arrangement. For example, the arrangement further comprises a second stopping storage element for storing the first and the second counter value and the logical states of the plurality of inverting elements, wherein the storage is triggered by a second stop signal. A second stopping decoder that is coupled to the second stopping storage element is, similar to the decoder described above, configured to select one of the first and the second counter value as a third valid value based on an evaluation of the logical states stored in the second stopping storage element. A second stopping value is output based on the third valid value and the logical states stored in the second stopping storage element. The second difference element determines a second difference value between the second stopping value and the starting value.

For example, in such a configuration the histogram block is configured to increment a value of one of the histogram bins selected depending on the second difference value. For example, both the first and the second difference value are processed within the same histogram block, such that with one counter for the starting event and two separate counters for the stopping events two events can be recorded within one measurement period corresponding to a starting event.

This approach can be extended to further stopping decoders, e.g. four stopping decoders for decoding four separate stop timestamps, however still not limited to such number. Respective modifications with respect to evaluation and storage in the histogram block become apparent to the skilled reader from the description above.

The various embodiments of a time-to-digital converter according to the improved timing concept may, for example, be used in time-of-flight, TOF, arrangements. For example, such TOF arrangements may emit an electromagnetic pulse, e.g. a light pulse, for example using a laser diode or a VCSEL. Emitting of the pulse can be detected with a photodetector, for example a single photon avalanche diode, SPAD. Reflected pulses can similarly be detected with such photodiodes or SPADs for generating the stopping signals.

In accordance with the improved timing concept, also a time-to-digital conversion method is disclosed that is to be used with a ring oscillator with a plurality of inverting elements, wherein each of the inverting elements provides a logical state.

In an embodiment, the method comprises incrementing a first counter value if a positive edge transition is present at one of the inverting elements, and incrementing a second counter value if a negative edge transition is present at the one of the inverting elements. The first counter value, the second counter value and the logical states of the plurality of inverting elements are stored, for example in response to a triggered signal. Based on an evaluation of the stored logical states one of the first and the second counter value is selected as a valid value. A total counter value is determined based on the valid value and the stored logical states.

For example, as described before for the time-to-digital converter arrangement, the valid value may be selected based on an evaluation of a combination of the stored logical states. In addition or as an alternative, the valid value may be selected based on a determination of a position of a propagating edge within a combination of the stored logical states.

Further implementations of the time-to-digital conversion method readily become apparent for the skilled person from the description of the time-to-digital converter arrangement above. It is particularly referred to the calculation of the total counter value, the storage of two or more sets of logical states and coarse counter values for determining a starting value and one or two stopping values, and to the storage of resulting difference values in a histogram.

BRIEF DESCRIPTION OF THE DRAWINGS

The improved timing concept will be explained in more detail in the following with the aid of the drawings. Elements having the same or similar function bear the same reference numerals throughout the drawings. Hence their description is not necessarily repeated in following drawings.

In the drawings:

FIG. 1 shows an example embodiment of a time-to-digital converter arrangement according to the improved timing concept;

FIG. 2 shows an example table of values in connection with the evaluation of stored logical states and counter values;

DETAILED DESCRIPTION

Figure 3:
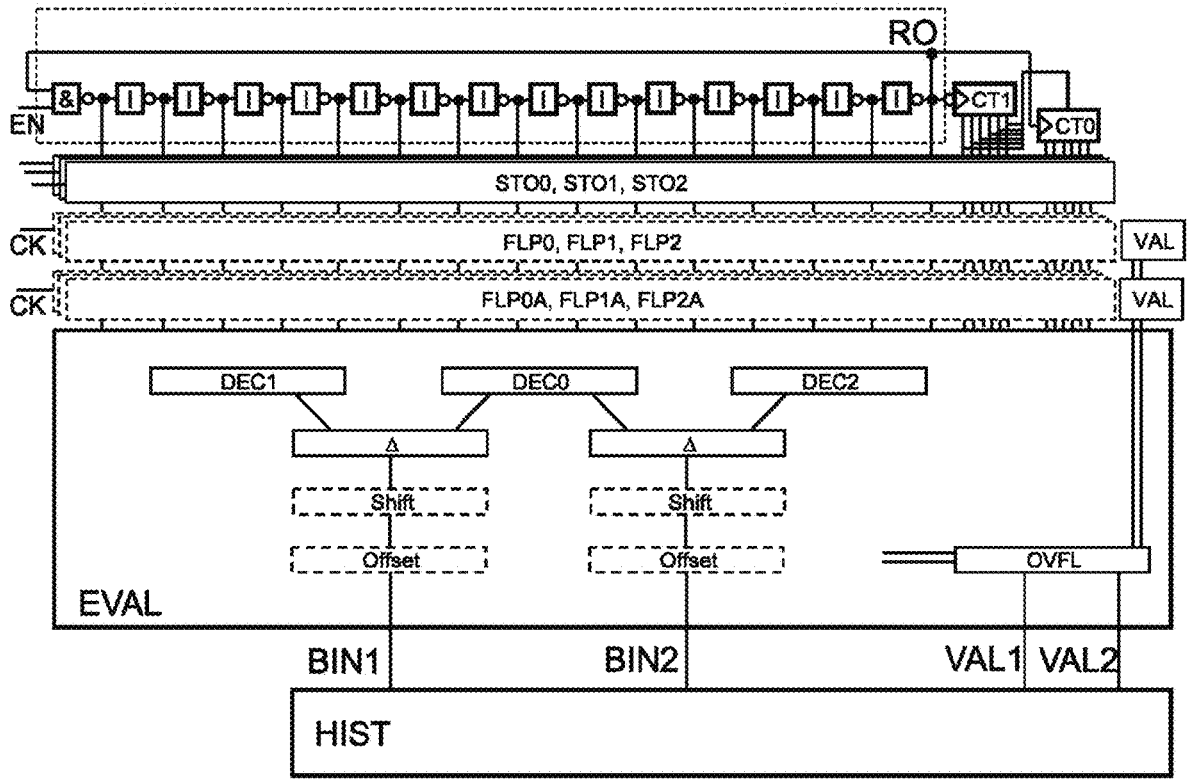
FIG. 3 shows a further example embodiment of a time-to-digital converter arrangement according to the improved timing concept.

FIG. 1 shows an example embodiment of a time-to-digital converter arrangement according to the improved timing concept. The arrangement comprises a ring oscillator RO, a first counter CT0, a second counter CT1, a storage element STO0, an optional stability element FLP0 and a decoder DEC0.

In this example embodiment, the ring oscillator is formed as a 15-stage ring oscillator acting as a fine counter and consists of a two-input NAND gate followed by fourteen inverters I that may be implemented as CMOS inverters. According to the common principle of a ring oscillator, the output of the last inverter is connected to one of the inputs of the input NAND gate. A second input of said NAND gate is provided with an enable signal EN for starting respectively stopping the oscillation process within the ring oscillator RO. The number of fifteen elements within the ring oscillator RO is chosen arbitrarily for this example and can be readily varied depending on the desired application. For example, a switching time of the inverters and the length of the inverter chain determines an oscillation frequency of the ring oscillator RO.

In the representation of the ring oscillator RO of FIG. 1, the last inverting element forms an output of the ring oscillator RO. However, also one of the other inverters I could be chosen as an output of the ring oscillator RO. The first counter CT0 is directly coupled to the ring oscillator output such that it counts positive signal edges respectively edge transitions at the ring oscillator output. Similarly, the second counter CT1 is connected to the ring oscillator output, but with an additional logical inversion at its input, such that negative edge transitions are counted by the second counter CT1.

Through respective connections of each of the elements of the ring oscillator RO to the storage element STO0, each logical state present at the inverter outputs can be stored in the storage element STO0. Such storage may be triggered by a trigger signal TG. In addition, actual counter values of the first and the second counters CT0, CT1 are provided to the storage element STO0, for example in a binary representation. For example, this depends on the internal bit length of the counter value within the counters CT0, CT1, which is chosen as 6 bit in this example. Preferably, storage of the counter values is triggered by the same trigger signal TG. The storage element STO0 may be implemented with a set of latches.

The stored logical states and counter values may be provided to the decoder DEC0 directly or via the stability element FLP0. The stability element FLP0 may be configured to clear any metastability conditions, which for example can be achieved by using flip-flop stages. Those flip-flop stages or other elements for achieving stability can be clocked with an external clock signal CK.

The stored logical states and counter values act as a time stamp defining a point in time in a non-ambiguous manner. Accordingly, the decoder DEC0 is configured to determine or calculate a total counter value COUT based on the logical states and counter values provided at its input. To this end, one of the counter values has to be selected as a valid coarse counter value while ignoring the other counter value. The selection concept is explained in the following.

In conventional time-to-digital converters, only a single counter is connected to an output of a ring oscillator. However, a time of an edge being present at the counter input to the instant where the counter value actually has increased is greater than the switching time, respectively delay, of one inverting element. For example, such time may be in the order of 4 to 10 inverter delays. Hence, with a conventional time-to-digital converter, in particular having only one counter, there are times where the counter has not assumed its correct value. Thus, if a triggering event falls within that time frame, a wrong counter value may be used. In addition, that time frame may not be constant but dependent on temperature or other process variations.

To this end, according to the improved timing concept, the time-to-digital converter arrangement has two counters, for which at least one has the correct value assumed due to counting different edge transitions. The decoder DEC0 therefore has to select which of the counters has the valid value. According to the improved timing concept, this selection is made based on an evaluation of the logical states stored in the storage element STO0. For example, the combination of the stored logical states is evaluated to make the selection. In addition or as an alternative, a position of a propagating edge within a combination of the stored logical states can be determined as a basis for the selection.

FIG. 2 shows an example table with reviews and logical states in connection with the ring oscillator RO and the counter CT0, CT1, in particular several consecutive combinations picked out during a full counting process. The table represents at least part of the logic behind the selection process for the valid value.

The first column represents a logical state of a counter tuple, wherein the digit before the dot is the logical coarse counter, and the digit after the dot counts from 0 to 29, representing a full period of the 15-element ring oscillator RO. The second column, named LV, represents the logical value of the logical states of the ring oscillator, wherein for ease of representation every second logical state is shown inverted. The next column, named PV, shows the logical states of the ring oscillator in its physical representation instead. The column named C0 represents the counter value of the first counter CT0, while the neighboring column named C1 represents the counter value of the second counter CT1. The column named COUT represents the total counter value output by the decoder DEC0, which is based on the tuple representation of the column to its left. The column named CC represents the selection of the counter values as valid values, wherein C0 denotes that the first counter value is to be used, C1 denotes that the second counter value C1 is to be used and C1-1 denotes that the second counter value decremented by one is to be used as the valid value. In other implementations, also one of the counter values C0, C1 incremented by one could be used appropriately.

The four rightmost columns show information that is deduced from the ring oscillator sample, i.e. the logical states, by combinatorial logic. In particular column A0 denotes where the logical representation of the logical states comprises zeros only, wherein the column named A1 indicates whether the logical representation of the logical states comprises only ones. In the example table of FIG. 2, the line 1.00 has all zeros, wherein the line 1.15 has all ones. This is expressed with 0=1 in column AO and 1=1 in column A1. In the respective following lines, a negative edge transition, respectively positive edge transition is present, denoted by N, respectively P, after column PV. An edge transition is detected at the first bit of the physical representation in column PV. In this example, a time of the edge transition to the actual increment of the respective counter is equal to four inverter delays. This may be different in other implementations.

It should be noted that the example selection in column CC is only one of several possibilities. One main constraint is that in the time after the edge transition, the respective counter value is, so to speak, unsafe to sample, such that the total counter value should be based on the other counter value having the half period phase shift.

Evaluation of the combination of the logical states of the inverters allows not only to determine whether an edge transition takes place for a given combination, but also gives a more detailed view on the phase situation within the ring oscillator, i.e. when an edge transition takes place or has taken place.

The relation between the combination of logical states and the selection of the valid value may be based on combinatorial logic, e.g. information as in the rightmost four columns. For example, the rightmost two columns denote an index at which position a positive, respectively negative, edge has been found in the ring oscillator. A negative value for that index corresponds to the second half period of that edge transition. Hence, based on the index information, the selection can be made which of the counter values C0, C1 is safe to sample.

In other implementations, for each combination of logical states the counter value to be chosen in advance may be stored, for example in a lookup table.

FIG. 3 shows a further example embodiment of a time-to-digital converter arrangement according to the improved timing concept which is based on the embodiment of FIG. 1. A main difference is given that instead of one storage element, one stability element and one decoder, the embodiment of FIG. 3 further includes two additional sets of these elements.

For example, the time-to-digital converter arrangement of FIG. 3 includes the first storage element ST0 as a starting storage element, and two further storage elements as a first stopping storage element STO1 and a second stopping storage element STO2. Similarly, the arrangement comprises the decoder DEC0 as a starting decoder and two further decoders DEC1, DEC2 as a first stopping decoder DEC1 and a second stopping decoder DEC2. The decoders DEC0, DEC1, DEC2 are shown in an evaluation block EVAL that will be explained later in more detail.

Between the storage elements STO0, STO1, STO2 and the decoders DEC0, DEC1, DEC2 respective stability elements are provided, e.g. with first flip-flop stages FLP0, FLP1, FLP2 and second flip-flop stages FLP0A, FLP1A, FLP2A, each clocked with the clock signal CK.

Each of the storage elements and decoders has the same function as described in conjunction with FIG. 1, including any possible and/or optional implementations. The same applies to the stability elements. Accordingly, these three sets of elements allow determination of three independent counter values. However, they share the common ring oscillator RO and the two counters CT0, CT1.

In this embodiment, the counter CT0 has an additional counter value input for receiving the output of the counter CT1 but is still triggered with the positive clock edge at the ring oscillator output. This connection achieves that the counters CT1, CT0 are running in lock step. Hence, it can be avoided that the two counters do not start at the same value.

Each of the storage elements ST0, ST1, ST2 is triggered by a separate, independent trigger signal. For example, storage element ST0 is triggered by a start signal, and the storage elements STO1, STO2 are triggered by respective first and second stop signals. For example, if the time-to-digital converter arrangement is used within a time-of-flight application, the start signal may be associated with the time instant sending out a pulse, e.g. a light pulse, and the two stop signals may be associated with individual reception of reflected pulses. For example, the stop signals may be generated with one or more SPADs.

In the evaluation block EVAL, a first difference value is determined between a first stopping value provided by the decoder DEC1 and the starting value provided by the decoder DEC0. Similarly, a second difference value is determined as a difference between a second stopping value provided by the decoder DEC2 and the starting value. The difference values are determined by respective difference elements A. Accordingly, the arrangement is able to detect and measure a time for two events in response to a single starting event. The two difference values represent a time given by the number of inverter delays times the actual inverter delay time.

For evaluation purposes, the difference values can be saved in a histogram block HIST, wherein the actual difference value determines the bin of the histogram, which should be increased, denoted by values BIN1, BIN2. The bins, respectively the time differences, define a measured distance. In time-of-flight, TOF, applications, such measurements are executed multiple times in a row until the histogram has enough hits such that targets can be detected and distinguished from noise.

The histogram size, that is the number of bins of the histogram, may be defined with a nominal duration of an inverter delay. If such duration changes due to different process parameters or application of different operation frequencies, high bin numbers may not be achievable, such that at least a part of the histogram bins remains unused. Hence, in order to make use of a greater portion of the histogram bins, the difference values as being output by the difference elements A may be binary-shifted to extend the bin range. This is shown with the optional blocks shift.

In some applications there may be a pre-known offset value that e.g. deteriorate the results. Hence, such pre-known offset may be subtracted from the difference value in optional offset blocks, resulting in values BIN1, BIN2.

The stability elements may include a detection mechanism, whether the stored logical states are transmitted without any metastability effects. This information may be used to decide whether the values respectively bin numbers BIN1, BIN2 can be validly written to the histogram, denoted by valid signals VAL1, VAL2. For example, valid signals VAL1, VAL2 may indicate whether there has been detected a stopping event at all, and/or whether the bin number should be written into the histogram memory. This may be combined with an optional overflow detection for detecting potential overflows in the counter values or resulting differences. This e.g. assures that too high values are not written to the wrong bin, e.g. by wrapping. For example in a memory with 256 bins, a bin value of 257 must not be written to bin number 1.

Figure 4:
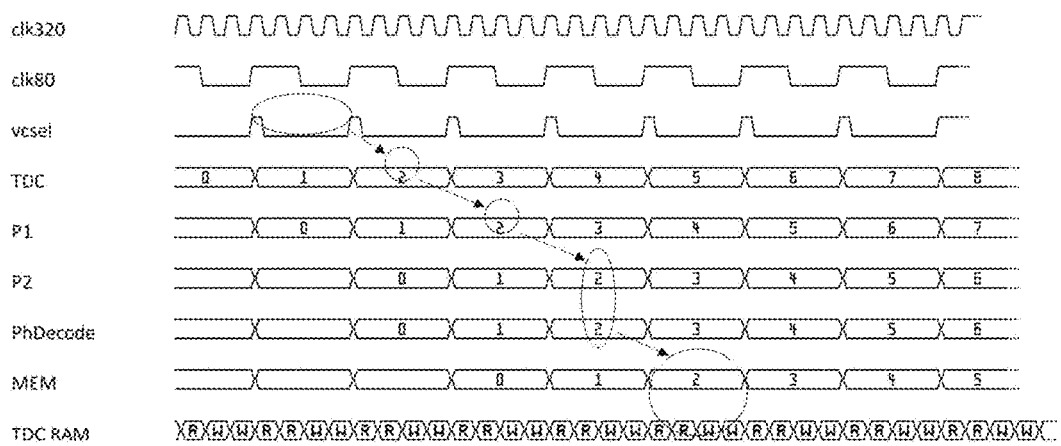
FIG. 4 shows an example time flow diagram for a time-to-digital conversion according to the improved timing concept.

FIG. 4 shows an example time flow for signal processing in the time-to-digital converter arrangement according to the improved timing concept. In this diagram the signal clk320 denotes a system clock, e.g. the clock for operating flip-flops etc. A second clock signal clk80 is a subdivided clock signal, which in this example has a quarter of the frequency of signal clk320. This clock signal clk80 is taken as a basis for triggering output pulses VCSEL. The signals below, namely TDC, P1, P2, PhDecode and MEM denote numbered processing frames corresponding to the signal flow within the arrangement. For example, signal TDC corresponds to the storage of the logical states within the storage elements. Signals P1, P2 correspond to the stability elements processing. Signal PhDecode corresponds to the operation in the decoders and signal MEM corresponds to the process of storing the results in the histogram.

In the example diagram of FIG. 4, the time flow for a second time frame is marked with respective circles and arrows. The last signal, TDCRAM, denotes an example RAM access scheme within the histogram block, wherein R stands for a read process and W stands for a write process. This will be explained in more detail later in conjunction with FIG. 6A and FIG. 6B.

Figure 5:
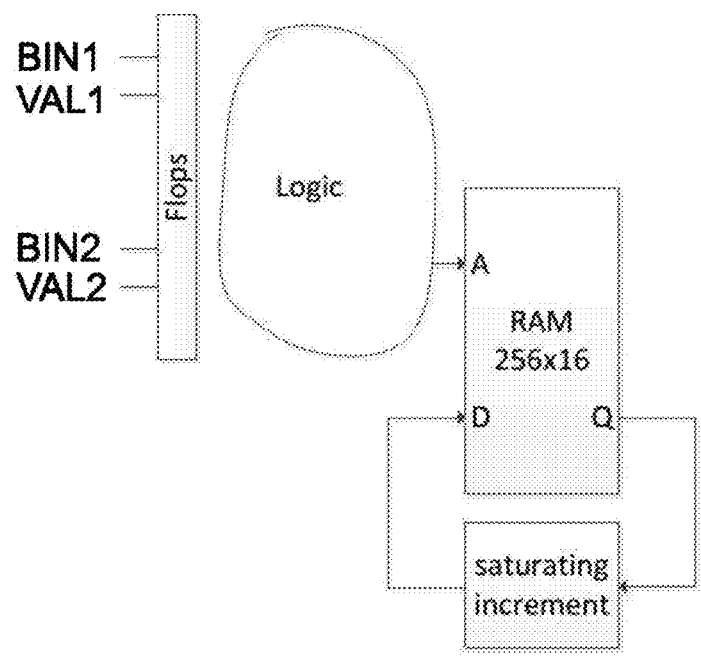
FIG. 5 shows an example detail of an embodiment of a time-to-digital converter arrangement.

In accordance with the time flow of FIG. 4, the TDC measurements are stored in a histogram memory, therefore each possible distance one RAM address contains the number of times that an event has been detected exactly at this time. The present implementation uses a synchronous pipeline approach. This avoids a congestion when multiple events are detected for the same bin and how to write asynchronously to the memory. Referring now to FIG. 5, a logic block implementing a histogram write mechanism flops the two tuples BIN1, VAL1, and BIN2, VAL2 and, if validity is asserted, increments the value stored at the bin address of the histogram RAM. In this example, the RAM has 265 bins with 16 bit. The incrementing is implemented in a saturating way via the saturating element, such that the value never wraps back to zero.

Figure 6A:
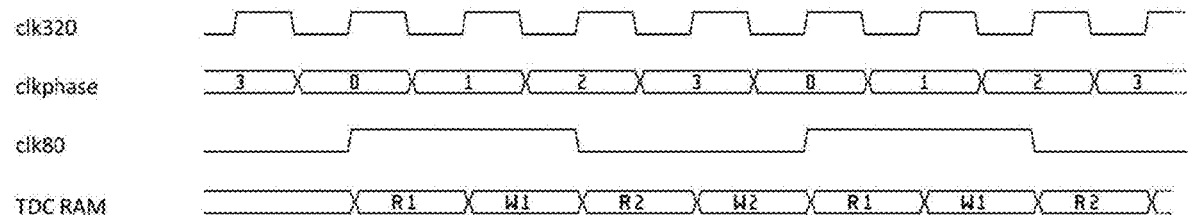
FIG. 6A and FIG. 6B show example time flow diagrams in connection with a histogram block.
Figure 6B:
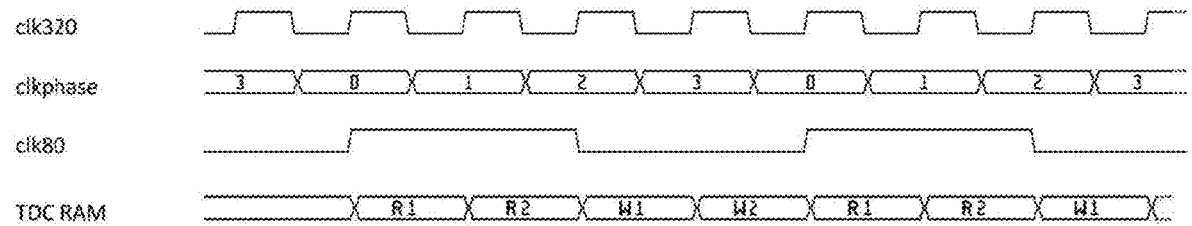

FIGS. 6A and 6B show two variants of a read modify write mechanism. In the first variant shown in FIG. 6A, each read process R1, R2 is immediately followed by a corresponding write process W1, W2. Hence, first the address defined by the value BIN1 is incremented and afterwards the address defined by value BIN2 is addressed.

In the second variant according to FIG. 6B, two read processes R1, R2 are executed immediately one after another and only after that are two write processes W1, W2 executed. In this implementation, if BIN1 and BIN2 point to the same address, then the access is being combined into a single increment by two. In addition, the second variant of FIG. 6B has relaxed timing requirements.

Figure 7:
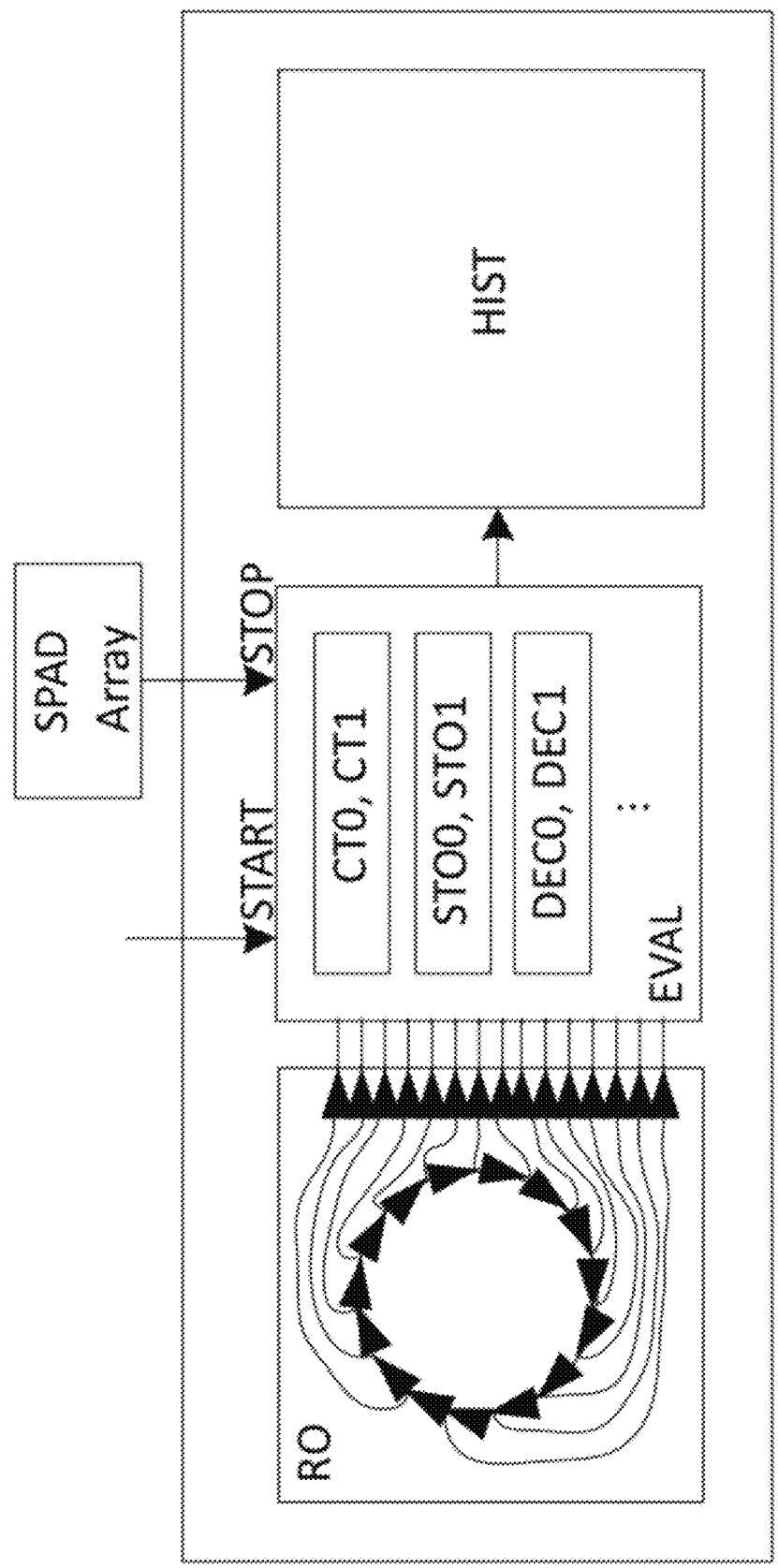
FIG. 7 shows an example implementation of a time-to-digital converter arrangement.

FIG. 7 shows an example implementation of a time-to-digital converter arrangement as e.g. implemented on a semiconductor chip. For example, the ring oscillator RO is located in a confined area wherein the logical states of the single inverters are provided to the evaluation block together with counters CT0, CT1, storage elements, decoders etc. the histogram block may be arranged in another area of the integrated circuit. In this example implementation, the stop signal may be provided from a SPAD array, while the start signal may be provided from the VCSEL clock or a starting pulse detector or the like. Hence, the implementation can be used with a TOF application.

During measurements, a CPU controlling the measurement process may be sleeping. Usually, the CPU defines a number of measurements to be taken, each having a defined nominal length. In the following two mechanisms are provided that implement a kind of automatic gain or automatic exposure control, such that the measurements run until the histogram is filled to a certain level. According to a first mechanism an automatic exposure is defined by a maximum bin height. For example, a maximum histogram content value can be defined, and as soon as this maximum is reached in at least one of the histogram bins, the measurement is stopped. This helps to prevent measurement inaccuracies from a saturating bin, and also helps with power conservation. For example, if there is enough signal present, there is no use to send out more light pulses. The maximum value may be defined by one or more bits to be achieved in the histogram memory, such that the maximum value can be selected in powers of two.

According to the second mechanism an automatic exposure is defined by a number of overall hits. During the measurement, the number of measured hits is accumulated and fed into a large counter. Using this as a condition to stop the measurements helps detect high ambient light situations early.

It should be noted that the improved timing concept can also be implemented with only two sets of storage elements, decoders etc. such that only one difference value is formed.

However, such implementation becomes apparent to the skilled person from the description of FIG. 3 in conjunction with FIG. 1.

The invention claimed is:

1. A time-to-digital converter arrangement, comprising
a ring oscillator with a plurality of inverting elements, each of the inverting elements providing a logical state;
a first counter coupled to the ring oscillator and being configured to increment a first counter value if a positive edge transition is present at one of the inverting elements;
a second counter coupled to the ring oscillator and being configured to increment a second counter value if a negative edge transition is present at the one of the inverting elements;
a storage element configured to store the first counter value the second counter value and the logical states of the plurality of inverting elements; and
a decoder coupled to the storage element and configured to select one of the first and the second counter value as a valid value based on an evaluation of the stored logical states, and to output a total counter value based on the valid value and the stored logical states.

2. The time-to-digital converter arrangement according to claim 1, wherein the decoder is configured to select the valid value based on an evaluation of a combination of the stored logical states.

3. The time-to-digital converter arrangement according to claim 2, wherein the decoder is configured to calculate the total counter value based on a numeric representation of the stored logical states and a multiple of the valid value or of the valid value reduced or incremented by one, depending on the combination of the stored logical states.

4. The time-to-digital converter arrangement according to claim 1, wherein the decoder is configured to select the valid value based on a determination of a position of a propagating edge within a combination of the stored logical states.

5. The time-to-digital converter arrangement according to claim 4, wherein the decoder is configured to calculate the total counter value based on a numeric representation of the stored logical states and a multiple of the valid value or of the valid value reduced or incremented by one, depending on the combination of the stored logical states.

6. The time-to-digital converter arrangement according to claim 1, further comprising a stability element coupled between the storage element and the decoder, the stability element configured to clear metastability conditions of the stored values and states.

7. The time-to-digital converter arrangement according to claim 1, further comprising
a further storage element configured to store the first counter value, the second counter value and the logical states of the plurality of inverting elements; and
a further decoder coupled to the further storage element and configured to select one of the first and the second counter value as a second valid value based on an evaluation of the logical states stored in the further storage element, and to output a further total counter value based on the second valid value and the logical states stored in the further storage element; and
a first difference element; wherein
the storage element is a starting storage element, wherein storage is triggered by a start signal;
the further storage element is a first stopping storage element, wherein storage is triggered by a first stop signal;
the decoder is a starting decoder outputting the total counter value as a starting value;
the further decoder is a first stopping decoder outputting the further total counter value as a first stopping value; and
the first difference element is configured to determine a first difference value between the first stopping value and the starting value.

8. The time-to-digital converter arrangement according to claim 7, further comprising a histogram block with a number of histogram bins, the histogram block configured to increment a value of one of the histogram bins selected depending on the first difference value.

9. The time-to-digital converter arrangement according to claim 8, further comprising
a second stopping storage element configured to store the first counter value, the second counter value and the logical states of the plurality of inverting elements, the storage being triggered by a second stop signal; and
a second stopping decoder coupled to the second stopping storage element and configured to select one of the first and the second counter value as a third valid value based on an evaluation of the logical states stored in the second stopping storage element, and to output a second stopping value based on the third valid value and the logical states stored in the second stopping storage element; and
a second difference element configured to determine a second difference value between the second stopping value and the starting value; wherein
the histogram block is configured to increment a value of one of the histogram bins selected depending on the second difference value.

10. A time-of-flight, TOF, arrangement comprising
a time-to-digital converter arrangement according to claim 1;
an emitter for emitting electromagnetic pulses;
a first photodetector for detecting the emitted electromagnetic pulses; and
at least one second photodetector for detecting reflected electromagnetic pulses.

11. A time-to-digital conversion method to be used with a ring oscillator with a plurality of inverting elements, each of the inverting elements providing a logical state, the method comprising incrementing a first counter value if a positive edge transition is present at one of the inverting elements;
incrementing a second counter value if a negative edge transition is present at the one of the inverting elements;
storing the first counter value, the second counter value and the logical states of the plurality of inverting elements;
selecting one of the first and the second counter value as a valid value based on an evaluation of the stored logical states; and
determining a total counter value based on the valid value and the stored logical states.

12. The method according to claim 11, wherein the valid value is selected based on an evaluation of a combination of the stored logical states.

13. The method according to claim 12, wherein the total counter value is calculated based on a numeric representation of the stored logical states and a multiple of the valid value or of the valid value reduced or incremented by one, depending on the combination of the stored logical states.

14. The method according to claim 11, wherein the valid value is selected based on a determination of a position of a propagating edge within a combination of the stored logical states.

15. The method according to claim 14, wherein the total counter value is calculated based on a numeric representation of the stored logical states and a multiple of the valid value or of the valid value reduced or incremented by one, depending on the combination of the stored logical states.

16. The method according to claim 11, wherein
the first counter value, the second counter value and the logical states of the plurality of inverting elements are stored in a starting storage element triggered by a start signal; and
the first counter value, the second counter value and the logical states of the plurality of inverting elements are stored in a first stopping storage element triggered by a first stopping signal;
the method further comprising:
selecting one of the first and the second counter value as the valid value based on an evaluation of the logical states stored in the starting storage element;
determining the total counter value as a starting value based on the valid value and the logical states stored in the starting storage element;
selecting one of the first and the second counter value as a second valid value based on an evaluation of the logical states stored in the first stopping storage element;
determining a first stopping value based on the second valid value and the logical states stored in the first stopping storage element; and
determining a first difference value between the first stopping value and the starting value.

17. The method according to claim 16, further comprising:
storing the first counter value, the second counter value and the logical states of the plurality of inverting elements in a second stopping storage element triggered by a second stopping signal;
selecting one of the first and the second counter value as a third valid value based on an evaluation of the logical states stored in the second stopping storage element;
determining a second stopping value based on the third valid value and the logical states stored in the second stopping storage element; and determining a second difference value between the second stopping value and the starting value.

18. The method according to claim 16, further comprising:
updating a histogram with a number of histogram bins depending on the first and/or the second difference value.

* * * * *